United States Patent [19]

Heitzler et al.

[11] Patent Number: 5,083,193
[45] Date of Patent: Jan. 21, 1992

[54] SEMICONDUCTOR PACKAGE, METHOD OF MANUFACTURING THE SAME, APPARATUS FOR CARRYING OUT THE METHOD, AND ASSEMBLY FACILITY

[75] Inventors: Viktor Heitzler, Umkirch; Richard Kapp, Glottertal, both of Fed. Rep. of Germany

[73] Assignee: Deutsche ITT Industries GmbH, Freiburg, Fed. Rep. of Germany

[21] Appl. No.: 389,718

[22] Filed: Aug. 4, 1989

[51] Int. Cl.$^5$ .................. H01L 23/28; H01L 23/48; H01L 29/44; H01L 29/60

[52] U.S. Cl. .................. 357/74; 357/70; 357/72

[58] Field of Search ............ 357/70, 72, 75, 74, 357/80, 85, 76

[56] References Cited

U.S. PATENT DOCUMENTS

| | | | |
|---|---|---|---|
| 3,231,797 | 1/1966 | Koch | 357/72 |
| 3,235,937 | 2/1966 | Lanzl et al. | 357/72 |
| 3,465,210 | 9/1969 | Bertram et al. | 357/72 |
| 4,346,396 | 8/1982 | Carroll, II et al. | 357/70 |

FOREIGN PATENT DOCUMENTS

| | | |
|---|---|---|
| 0009135 | 4/1980 | European Pat. Off. . |
| 0066188 | 12/1982 | European Pat. Off. . |
| 0100574 | 2/1984 | European Pat. Off. . |
| 2360174 | 2/1978 | France . |
| 2390008 | 12/1978 | France . |

OTHER PUBLICATIONS

Patent Abstracts of Japan, vol. 7, No. 233, Oct. 15, 1983 "Hybrid Integrated Circuit Device", Pat. No. 58-121652.
Patent Abstracts of Japan, vol. 9, No. 298, Nov. 26, 1985 "Semiconductor Device and Manufacture Thereof", Pat. No. 60-136347.
Patent Abstracts of Japan, vol. 9, No. 318, Dec. 13, 1985 "Case for Semiconductor Device", Pat. No. 60-150654.

*Primary Examiner*—James, Andrew J.
*Assistant Examiner*—Carl Whitehead, Jr.
*Attorney, Agent, or Firm*—Thomas L. Peterson

[57] ABSTRACT

To further reduce the manufacturing costs of semiconductor devices, such as TO-92 transistors or thyristors, a prefabricated plastic can or housing is filled with cast resin, and the chip, together with its leads and a synthetic-resin cover, is inserted into the cast resin and the can, with portions of the leads engaging a groove in the can. The apparatus for inserting the chips, etc., into the cans includes a feed rail for the cans, a centering slide, and a swivelling gripper onto which the cans are pushed by the centering slide. When rotated, the swivelling gripper slips the cans over the chips mounted on a lead frame moving above the swivelling gripper.

7 Claims, 3 Drawing Sheets

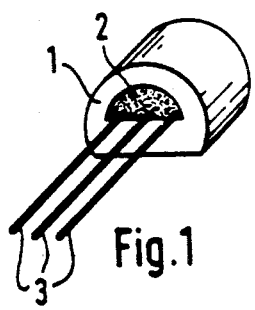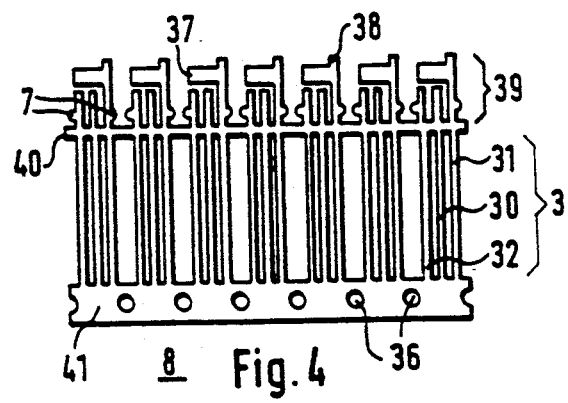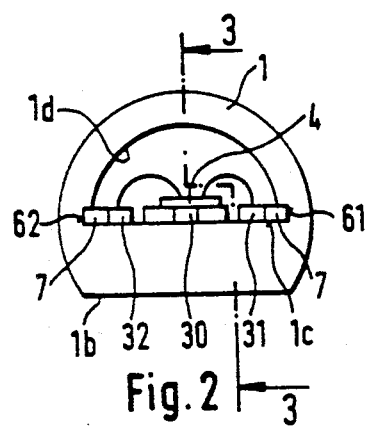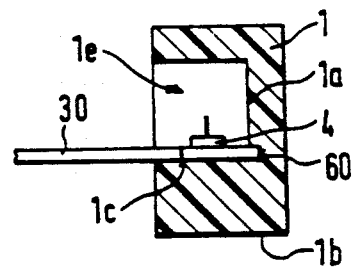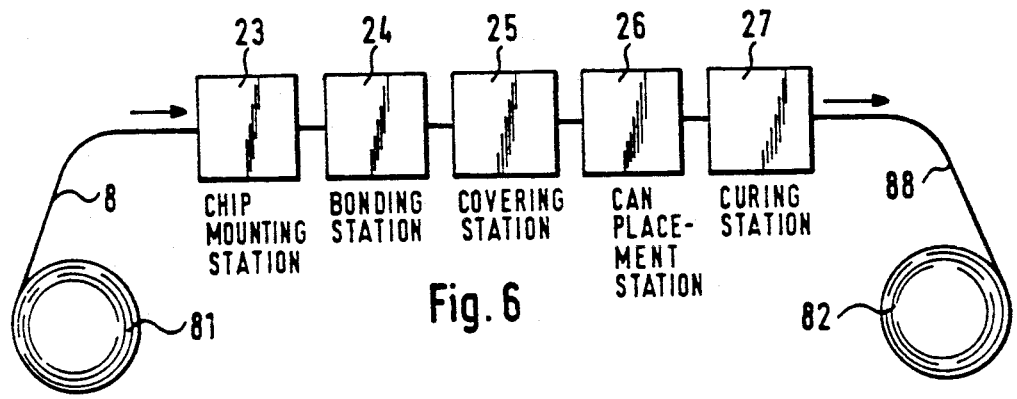

SEMICONDUCTOR PACKAGE, METHOD OF MANUFACTURING THE SAME, APPARATUS FOR CARRYING OUT THE METHOD, AND ASSEMBLY FACILITY

TECHNICAL FIELD

The present invention is directed to a semiconductor package, its method of manufacture and the apparatus used to affect its manufacture.

BACKGROUND OF THE INVENTION

One of the most widely used plastic encapsulations for small-power semiconductor devices, such as transistors, thyristors, or similar three-lead semiconductor devices, is the well-known TO-92 package, which has a shape of a cylinder with a segment cut off parallel to the center line. The semiconductor chip and its leads are hermetically embedded in plastic and, thus, protected against mechanical and chemical influences, such as the penetration of moisture.

In the fabrication of such semiconductor devices with a plastic package, the manufacture of the chip begins with a semiconductor wafer on which several hundred to several thousand identical chips are fabricated. The manufacture of the leads for the chips begins with a lead frame in which several thousand leads are firmly interconnected by cross-links which are removed in one of the last process steps before the final test in order to remove the short circuit caused by the cross-links.

In the set of leads belonging to a single semiconductor device (in the case of the TO-92 package, this is normally a lead triplet), the inner end of one of the leads has such a large area that the chip can be conductively attached thereto, e.g., by means of a conductive adhesive.

During manufacture, the bare lead frame unwinds from a reel and first reaches a chip-mounting station, in which the individual chips are removed from the semiconductor wafer and mounted on the lead area intended for this purpose. At a bonding station, the inner ends of the other chip leads are then connected with contact areas of the chip by fine wires. Thereafter, the chip and the fine bonding wires are covered with a synthetic-resin material, after which the lead frame is reeled again, because packaging is performed in a fabrication step spatially separated from the steps described so far. As a result, the time required by a lead frame to pass through all stages of the manufacturing process is very long.

The mounting of the chip on the lead frame, the bonding of the latter to the contact areas of the chip, and the covering of the chip are spatially separated from the packaging step for several reasons. First, the devices needed for these operations greatly differ in size, so that they cannot be directly spatially associated with one another. Second, the encapsulating devices are presses, for example, which operate with high pressure and, thus require heavier foundations than the chip-mounting, handling and covering devices. Third, the chip-mounting devices and the encapsulating presses have different cycle times, which are difficult to adapt to one another.

The manufacturing method just described also results in so-called webs between the individual leads, which are unavoidable because one of the aforementioned cross-links is used to seal the injection or compression mold. These webs are removed in a separate, sandblasting-like process step, so that the lead frame, which are wound on a reel after the encapsulating step, must be transported to the place where this step is performed.

Finally, the manufacturing process described requires the use of plastics whose composition is adapted to the specific requirements of both the packaging process and the above-mentioned properties, i.e., the selection of the plastics is subject to a number of constraints. For example, they must be sufficiently flowable at as low a pressure as possible so as to fill the mold without forming shrink holes, and nevertheless perform their protective function on the finished semiconductor device.

Although the aforedescribed process is a well-proved mass-production process since it is the least expensive process developed so far and has gained wide acceptance that it can be described as today's standard process, efforts are still being made particularly with a view to further reducing the manufacturing costs of semiconductor devices.

Accordingly, the object of the present invention is to provide a semiconductor device which has a plastic package of an improved design compared to the hitherto widely used plastic packages in order to achieve a manufacturing cost reduction. It is another object to provide a manufacturing technique and apparatus which permits the various steps used to assemble the device to occur in close proximity to one another.

An important feature of the present invention provides for the manufacture of the plastic package, hitherto made on the lead frame, by embedding or molding the chip in a can-shaped housing in a separate step, which offers the advantage of greater freedom in the choice of the starting plastic and the temperatures and pressures to be used in the packaging process. For example, the can is filled with a cast resin prior to the insertion of the chip, etc., and the can placement station can be placed in close proximity to the stations for mounting the chip, etc.

The invention offers the following advantages. A low-cost plastic can be used for the can. The step of removing the webs and, thus, the device necessary for this purpose are eliminated. The presses for producing the can-shaped housings can be simpler in design and, thus, smaller than the presses used so far. The need for two transfers of the equipped lead-frame reels (from a conventional assembly station to the presses and from the presses to the sandblasting station) is eliminated. This reduces the total time of passage of the lead frame considerably, e.g., by more than one half. All process steps necessary to manufacture the plastic package with the chip and its leads can be performed in a single assembly facility which does not take up more area than a conventional assembly facility, so that a large number of such assembly facilities can be accommodated in a manufacturing shop as before, because the can placement station can be located above the stations for assembly.

BRIEF DESCRIPTION OF THE DRAWINGS

This invention will now be explained in greater detail with reference to the accompanying drawings, in which:

FIG. 1 is a perspective view of an embodiment of the semiconductor device according to the invention;

FIG. 2 is an enlarged front view of the embodiment of FIG. without cast-resin filling;

FIG. 3 is a vertical section view taken through the device of FIG. 2;

FIG. 4 shows an embodiment of a lead frame as used in the invention;

FIG. 6 is a schematic view of an embodiment of an assembly facility according to the invention.

DETAILED DESCRIPTION

Figure 5:
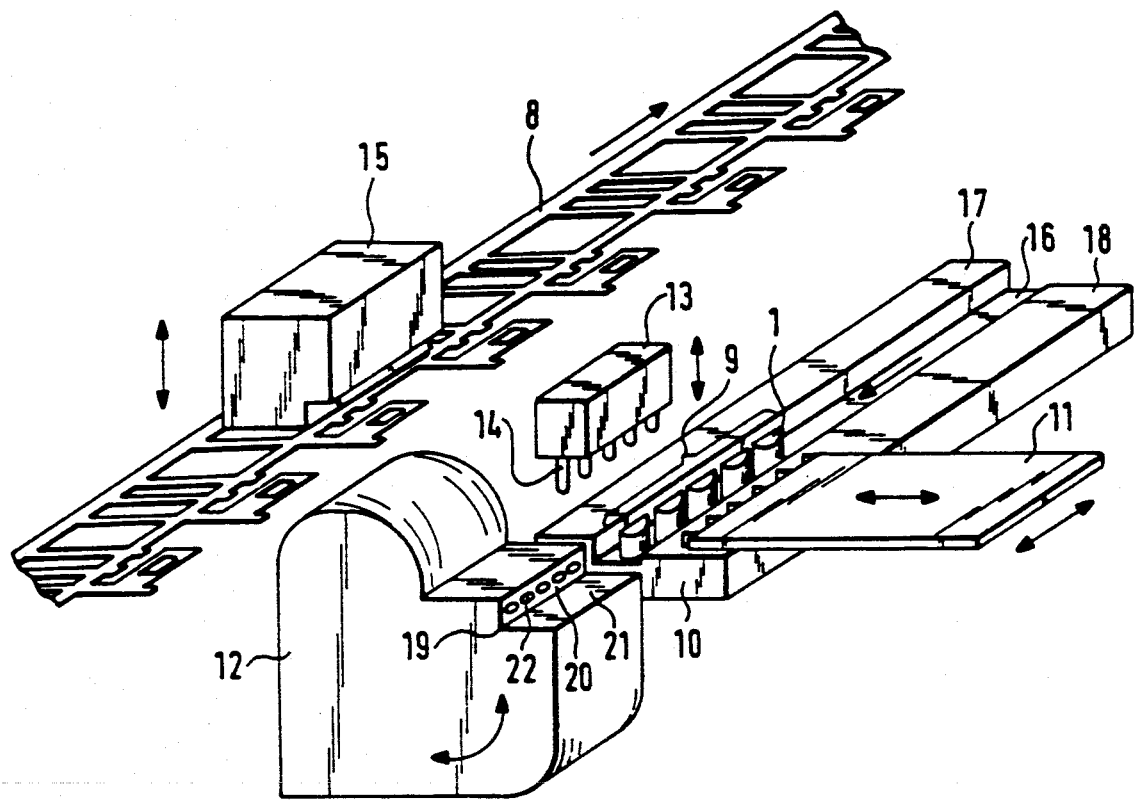
FIG. 5 is a perspective schematic view of an embodiment of an apparatus according to the invention for inserting chips and their leads into can-shaped housings.

The perspective view of the embodiment of FIG. 1 shows a transistor or thyristor in a package which is of the typical TO-92 shape. The can-shaped housing 1, or simply "can", is filled with a cast resin 2, which has cured around the semiconductor device disposed inside the can. The three leads, collectively identified by a numeral 3, and via which the transistor or thyristor can be connected to the circuit in which it is to be used, project from the cast resin 2.

FIG. 2 shows the internal structure of the can depicted in FIG. 1 in an enlarged view. For ease of representation, no cast resin is depicted in the can 1 and a synthetic-resin cover 5 (see FIG. 7) has been omitted, so that the individual leads 30, 31, 32 and the chip 4 as well as further details can be more easily represented in this figure.

The size or the width of the opening of the can 1 is such that it is just large enough to receive the part of the lead frame 8 bearing the chip 4 and including the leads 30, 31, 32. That means the size depends on the size of the chip 4 to be encapsulated and therefore on the dimensions of the lead frame 8. Usually, the width of the opening in the can is about 3 mm, but this is a matter of design choice.

Each of the two outer leads 31, 32 is preferably provided with a lug 7 which engages a corresponding groove 61, 62 with a slight press fit. The press fit is obtained by suitable choice of the outer dimensions of the lug with respect to the inner dimensions of the grooves in the side-walls of the can 1. The slight press fit prevents the can from falling off the lead frame before the cast resin is loaded and cures.

A groove 61 begins at the opening of the can 1 and runs toward the bottom 1a of the can in a direction perpendicular thereto. Along the bottom 1a, a groove 60 runs toward the opposite sidewall, from which a groove 62 runs parallel to the groove 61 up to the opening. It is not necessary for the grooves 60, 61, 62 to form one continuous groove, but they should preferably lie in a common plane.

Instead of providing the two outer leads 31, 32 with the lugs 7, those skilled in the art may prefer to form the outer leads 31, 32 in a different manner so that they will engage the grooves 61, 62. This can be done, for example, by making the leads 31, 32 wider inside the housing than outside the housing, but this widening need not extend over the entire length of the inner lead ends.

Figure 7:
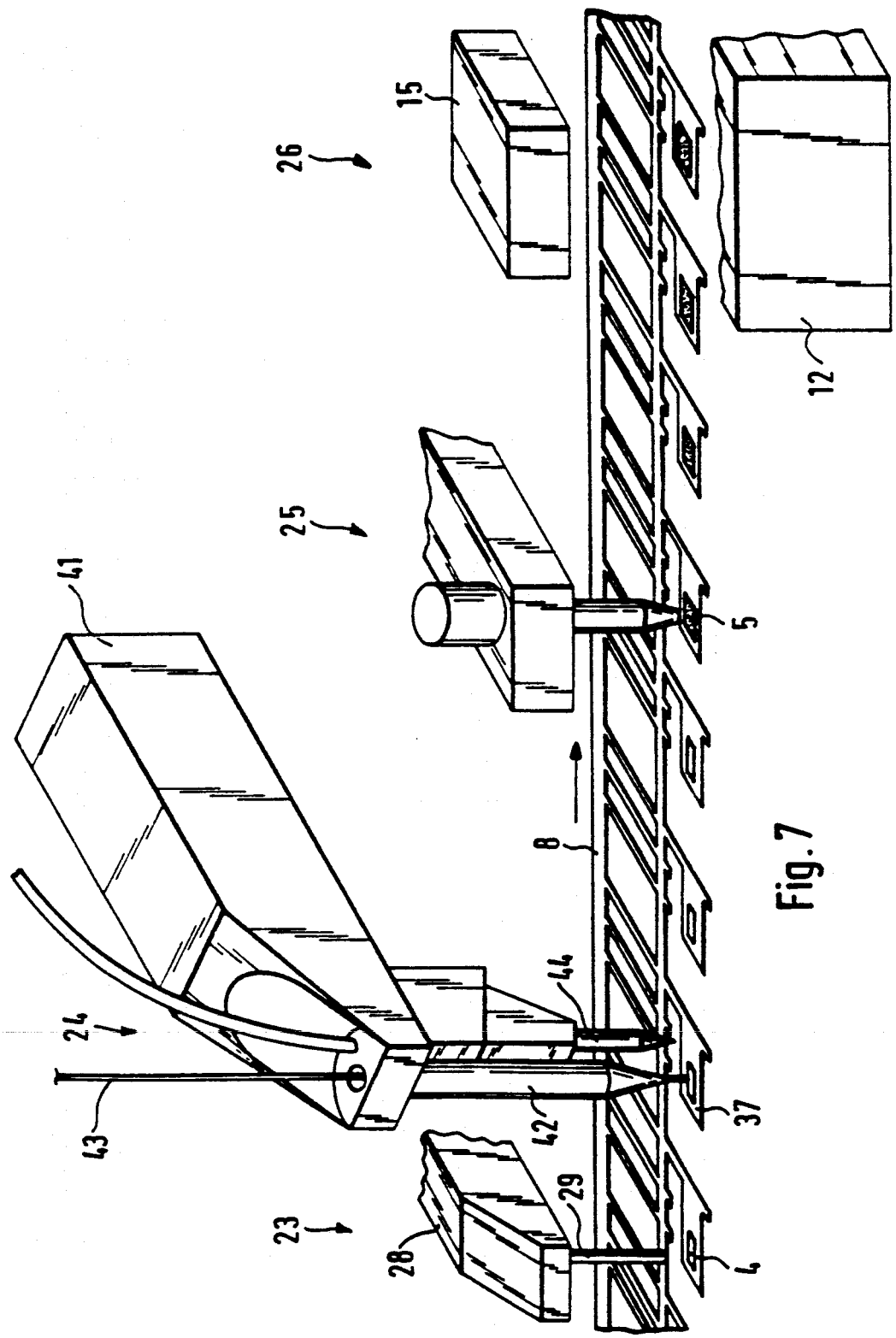
FIG. 7 is a schematic view of an embodiment of part of the stations of the assembly facility of FIG. 6.

At the inner end of the central lead 30 depicted in FIG. 2 is a correspondingly large area on which the chip 4 is mounted, while each of the other contact areas at the surface of the chip are connected to one of the outer leads 31, 32 either by a bonding wire or by other techniques well known to those skilled in the art. The chip 4, the bonding wires, and corresponding portions of the leads are provided with a synthetic-resin cover 5, as can be seen in FIG. 7. The latter can be formed, for example, by depositing a suitable quantity of synthetic-resin powder which is subsequently cured by being heated, or applying a drop of a flowable synthetic resin and then curing it. A suitable resin is manufactured by Dexter Hysol under the name of Hysol DK 180765.

In the disclosed embodiment of the invention, using a TO-92 style package, the hollow space 1e of the can 1 is only sufficiently wide in the direction perpendicular to the plane of the inserted leads 3 that the chip 4 with the synthetic resin cover can just be inserted into its opening. Then, the bottom surfaces of the leads 30, 31 and 32, which face away from the chip 4, are disposed on an inner surface 1c of the can, which surface 1c is preferably arranged parallel to the outer segment surface 1b of the TO-92 package, and the grooves 61, 62 run along the transition of this inner surface 1c to the sidewalls 1d of the hollow space 1e.

FIG. 3 shows a vertical section view through the arrangement of FIG. 2, so that it can also be seen how the end portion 38 (see FIG. 4) of one of the inner lead ends is fitted in the bottom groove 60.

A part of the lead frame 8 used in the invention is shown in FIG. 4. The leads 3 are combined into lead triplets by being firmly interconnected by means of a narrow cross-link 40 and a wide cross-link 41, which contains sprocket holes 36 whose spacing is preferably equal to the pitch of the lead triplets. In the area of the inner lead ends 39, the lugs 7, the areal widening 37 of one of the leads (in FIG. 4, it is the outer lead 31, while in FIG. 2 this is the central lead 30 which is widened—the lead which is widened is a matter of design choice) and the end portion 38 are all shown.

FIG. 5 is a perspective, schematic view of an embodiment of an apparatus according to the invention for inserting chips and their leads into the can-shaped housings previously described. This apparatus includes a feed rail 10, which the cans enter with their openings 1e (FIG. 3) directed upwards. They preferably have been aligned by a conventional alignment device, such as a screw conveyor of suitable design. In the case of the TO-92 packages, they are so aligned that their side surfaces 1b slide along one sidewall of the rail 10.

A centering slide 11, which is movable in the longitudinal direction of and perpendicular to the feed rail 10, grasps a predetermined subset 9 of cans 1 and is disposed at an exit end of the feed rail 10. In FIG. 5, five cans form a subset 9, but this number is, of course, a matter of design choice.

Disposed behind the exit opening of the feed rail 10 is a swivelling gripper 12, onto which the subset 9 is pushed by the centering slide 11. According to one advantageous aspect of the invention, each can 1 can be held on the swivelling gripper 12 via one of the depicted suction openings 22. The swivelling gripper 12 is rotatable about its longitudinal axis through, e.g., 90°, so that the cans 1 of the subset 9, which are initially held on the gripper 12 with their openings directed upwards, can later be rotated so that the plane of their openings is approximately horizontal.

Mounted above the openings of the cans 1 is a cast-resin-metering device 13, which has a number of outlets 14, preferably in the form of outlet tubules, equal to the number of cans of the subset 9, and which fill just enough cast resin 2 into the hollow spaces 1e of the cans 1 such that after insertion of the chip, etc., the hollow space is completely filled. The spacing of the outlets 14 is equal to the spacing of the cans. The cast-resin-metering device 13 can be located either above the cans of the subset 9 to be grasped by the centering slide 11 or above the subset held in place by the swivelling gripper 12, the latter alternative being generally preferred because in that case the cans are particularly well fixed before being loaded with cast resin 2.

The lead frame 8, provided with the chips, their bonding wires, and the synthetic resin cover, travels above the swivelling gripper 12 and is temporarily fixed by a hold-down device 15, so that by rotating the swiveling gripper 12, the subset of cans, which are now partially filled with cast resin 2 and are held by the gripper 12, can be slipped over the chips 4, with each can fitting on one chip, and the associated chip-mounting portions of lead frame 8. In FIG. 5, lead frame 8 is shown schematically and over-sized for ease of illustration.

The cast resin 2 should preferably be liquid or at least flowable at room temperature so that it can be poured or loaded into the openings of the cans 1, yet its surface tension should be such that the resin 5 does not readily flow out when the cans 1 are rotated from their upright position to the horizontal position to receive the chips 4. A resin which complies with these requirements is sold, for example, by Dexter Hysol under the name Hysol EO 7010, which is a one component encapsulation resin.

In a preferred embodiment of the apparatus of FIG. 5, the feed rail 10 has a U-shaped section with a bottom 16, a longer leg 17 and a shorter leg 18. The centering slide 11 is disposed on the shorter leg 18, so that the TO-92 cans rest with their side surfaces 1b (FIG. 3) against the longer leg 17 and rise above the shorter leg 18, so that they can be grasped by the centering slide 11.

In another preferred embodiment of the apparatus of FIG. 5, the swivelling gripper 12 has a rectangular recess 19 whose vertical surface 20 is flush with the inside wall of the longer leg 17 of the feed rail 10, and whose horizontal surface 21 is flush with the bottom 16; The vertical surface 20 preferably containing the above-mentioned suction openings 22.

FIG. 6 schematically depicts a scheme of an assembly facility which may be used for manufacturing a plurality of semiconductor devices according to the present invention. On one side of the facility the bare lead frame 8 is wound on a reel 81. From there, it moves in the direction indicated by the arrow, passing a chip-mounting station 23, a bonding station 24, a covering station 25, a can placement station 26, and a curing station 27, unless curing is performed at lead-frame reel 82 after being equipped with semiconductor chips or devices. After leaving the curing station 27 (if used), the lead frame 88, now equipped with the semiconductor devices, is wound on the reel 82.

FIG. 7 shows the succession of the stations 23 . . . 26 of FIG. 6 in greater detail. The lead frame 8, in which the sprocket holes in the wide cross-link have been omitted for simplicity of illustration, moves below the individual stations. The chip-mounting station 23 includes a pickup device 28 and, if necessary, a conductive-adhesive-metering device which applies a droplet of conductive adhesive to the lead frame before the chip 4 is put down. The chip 4 is lifted off its semiconductor wafer by the pickup device 28, which is preferably rotatably mounted via tubule 29, which holds the chip by suction and releases it when placing it on the lead frame 8.

The bonding station 24 includes a swivelling holder 41, to which an additional tubule 42 is attached. A bonding wire 43, which unwinds from a reel (not shown), runs through this tubule and emerges at its tip. By lowering the tubule 42, the bonding wire is pressed on the metal layer of the contact area of the chip 4. Attached parallel to the tubule 42 is the additional tubule 44, through which a reducing agent, such as hydrogen, is emitted for reducing the surface of the areal lead end 37 if this end is made of copper, for example, as is generally the case.

At the covering station 25, a predetermined quantity of resin cover material 5 is applied, in powder or droplet form, to the chip 4 mounted on the lead end 37 and to the bonding wires. Finally, the lead frame 8, which is moved step-by-step from the left to the right (in the direction of the arrow by means of the sprocket holes shown in the lead frame as depicted in FIG. 4), reaches the can placement station 26, an embodiment of which is shown in FIG. 5, and which is indicated only schematically in FIG. 7 by the parts 12 and 15, for ease of illustration. The lead frame may then travel from there to the curing station 27, which is provided, in the simplest case, by a heat or ultraviolet-light source mounted above or below the lead frame.

Finally, the method of manufacturing the plurality of semiconductor devices will be explained. The chips 4 are mounted on the areal lead ends 37, and their contact areas are connected with the outer associated lead ends 39, by the wire bonding disclosed herein or by other techniques known to those skilled in the art. Next, each chip 4 is provided with the synthetic-resin cover 5 by applying a measured quantity of synthetic-resin powder or a corresponding synthetic-resin drop and then heating it. Then, the subset 9 of the plurality of cans 1 is simultaneously filled with the case resin 2, and after that, a subset 9 of associated chips 4, together with their lead ends 39, is simultaneously inserted into the subset of cans. The lead frame 8 is then heated to cure the cast resin 2 and, if necessary, to further cure the synthetic-resin cover 5.

Those of ordinary skill in the art will be readily able to modify the invention so that it can also be realized for plastic-package types other than that described herein. It should now be clear to a person skilled in the art that the design of the apparatus according to the invention for placing the cans on the chip-mounted frames is dependent on the shape of the package, and that for other package types, the disclosed apparatus can be modified as necessary to suit those package types.

Having described the invention with reference to preferred embodiments thereof, modification will now suggest itself to those skilled in the art. The invention is not to be limited to the disclosed embodiments, except as required by the following claims.

We claim:

1. A semiconductor device comprising:
   (a) a performed housing having an opening defining a hollow space therein and having grooves in the hollow space of the housing which run, respectively, from the opening of the housing along a sidewall, toward and along a bottom in a direction perpendicular to the bottom, and along another sidewall disposed essentially parallel to the first-mentioned sidewall;
   (b) a plurality of leads extending from outside said housing to within said hollow space, one of said leads having a mounting surface at its inner end upon which a chip can be mounted; and
   (c) a chip mounted on said mounting surface of said one leads, said chip having areas each connected with an inner end of at least one of the other of said plurality of leads, the inner ends of the leads being inserted through said opening and into said hollow space in said housing such that at least a portion of the outermost edges of said plurality of leads engage said grooves with a slight interference fit and that end portions of at least one inner end of said leads engage the groove at the bottom of said housing at least in part.

2. A semiconductor device as claimed in claim 1, wherein at least one lug is provided on edges of said leads, said at least one lug engaging said grooves.

3. A semiconductor device as claimed in claim 1, wherein said leads define a plane and wherein in a plane perpendicular to the plane of the inserted leads, the hollow space of the can (1) is only so wide that chip, leads and synthetic-resin cover are just insertable therein.

4. A semiconductor device as claimed in claim 1, wherein said housing is a preformed, plastic housing.

5. A semiconductor device as claimed in claim 1, wherein the opening in said housing is filled with a resin material.

6. A semiconductor device as claimed in claim 1, wherein said chip is provided with a synthetic-resin cover.

7. A semiconductor device as claimed in claim 1, wherein the opening in said housing is arc-shaped, thereby providing a flat surface, the grooves being located immediately adjacent said flat surface.

* * * * *